(12) United States Patent
Engel et al.

(10) Patent No.: US 6,529,306 B1
(45) Date of Patent: Mar. 4, 2003

(54) ELECTROMAGNETIC INTERFERENCE REDUCTION METHOD AND APPARATUS

(75) Inventors: Andrew Engel, Mountain View, CA (US); Christopher Coleman, Santa Clara, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 65 days.

(21) Appl. No.: 09/715,971

(22) Filed: Nov. 17, 2000

(51) Int. Cl.[7] .............................. G02G 1/03; H05K 9/00
(52) U.S. Cl. .......................................... 359/245; 174/35
(58) Field of Search ........................... 359/245, 129, 359/152, 153, 154, 2, 237; 343/772, 851, 872; 342/156, 157, 158, 159; 361/818; 389/14, 88, 89, 92, 131; 257/93; 372/97, 101, 103; 174/35

(56) References Cited

U.S. PATENT DOCUMENTS

| | | | | |
|---|---|---|---|---|
| 4,767,969 A | * | 8/1988 | Green ........................ 315/85 |
| 5,032,689 A | * | 7/1991 | Halligan et al. ........... 174/35 R |
| 5,113,475 A | | 5/1992 | Baker ........................ 385/138 |
| 5,202,536 A | * | 4/1993 | Buonanno ................. 174/35 GC |
| 6,062,738 A | | 5/2000 | Braquet et al. ............ 385/59 |
| 6,220,878 B1 | * | 4/2001 | Poplawski et al. ........ 439/92 |
| 6,426,459 B1 | * | 7/2002 | Mitchell ................... 174/35 MS |

* cited by examiner

*Primary Examiner*—Georgia Epps
*Assistant Examiner*—Omar Hindi (57) ABSTRACT

A method and system for reducing electromagnetic interference (EMI) that escapes a chassis for housing electro-optic components. The chassis includes a plurality of optical modules that each has a slot with a first dimension and a second dimension through which EMI can escape. An optical array is disposed in the slot. The optical array has a plurality of optical elements. At least one strip of conducting material is positioned between two optical elements at predetermined intervals as measured along the first dimension. The strip has a first end and a second end and is configured to extend substantially the second dimension. At least one of the first end or the second end is coupled to a ground potential. The strips effectively reduce the amount of EMI that escapes from the slot.

17 Claims, 5 Drawing Sheets

ELECTROMAGNETIC INTERFERENCE REDUCTION METHOD AND APPARATUS

FIELD OF THE INVENTION

The present invention relates generally to electro-optic transmitters, receivers, and transceivers, and more particularly, to an electromagnetic interference reduction method and apparatus for use with such transmitters, receivers, and transceivers.

BACKGROUND OF THE INVENTION

With the growth of computer networks (e.g., the Internet and the World Wide Web), the demand for network devices that form these networks is also rapidly increasing. A measure of performance of these network devices is the rate or speed at which the devices transfer data. As the information that needs to be transferred across the network becomes more voluminous and complex (e.g., the distribution of audio files, video files, and software programs over the network), networking companies are constantly challenged to design and manufacture networking products (e.g., switches and routers) that push the envelope in terms of the speed at which these products transfer data.

One way to enhance the speed of distributing data across a network is to utilize light to carry information and to use fiber optics as a transport mechanism. One advantage of using fiber optics is that a greater volume of data can be transferred at higher speeds via fiber optic cables as compared to electrical wires. However, signals are typically generated by a digital system (e.g., a web browser program executing on a computer) in an electrical format. Consequently, one important component in these networking devices is an optical module for converting electrical signals into optical signals and vice versa.

Examples of optical modules are optical receivers, optical transmitters, and optical transceivers. An optical receiver is a circuit that receives light signals from an optical medium (e.g., an optical fiber cable) and converts these light signals into corresponding electrical signals. An optical transmitter is a circuit that receives electrical signals and converts these electrical signals into corresponding light signals suitable for transmission across an optical medium, such as fiber optic cables. When a circuit includes both the functionality of an optical receiver and an optical transmitter, the circuit is commonly referred to as an optical transceiver.

Electromagnetic Interference (EMI) Regulations

Another important design consideration for manufacturers of electrical products is to ensure that the device complies with governmental regulations concerning electrical noise. One such regulation is promulgated by the Federal Communication Commission (FCC), Part 15, Class A that specifies the amount of allowed electromagnetic interference (EMI) that can escape from an electronic device. Devices that are distributed in other jurisdictions often need to comply with that jurisdiction's regulations concerning EMI emission. For example, products distributed in Europe typically need to comply with the International Special Committee on Radio Interference (CISPR) Publication 22 that specifies the amount of EMI emission allowed for electronic products.

Chassis Design

In current designs, a chassis for housing the electrical-optical components of a networking device is made of a conductive material (e.g., a metal). The metal effectively prevents any EMI generated by the components of the networking device from escaping from the inside of the chassis (i.e., the metal effectively confines EMI to inside the chassis). However, the chassis has a plurality of openings formed therein for providing access to the inside of the chassis. Examples of these openings include an opening for receiving the power cord, openings for ventilation, etc. An important type of such openings are openings in the chassis for receiving the optical modules (e.g., optical transmitter, optical receiver, and optical transceiver) described previously that provide an interface between an optical medium (e.g., a fiber optic cable) and a laser (e.g., a Vertical Cavity Surface Emitting Laser (VCSEL)) or a photodiode (e.g., a PIN diode).

The optical module includes a surface for defining a slot for allowing light to pass there through so that the light signals described above can be communicated with the components of the network device. The slot has disposed therein an optical element that is typically made of a non-conductive material, such as plastic. The optical element provides an optical interface between the laser and the fiber optic cable that typically re-directs, focuses and launches the light into the fiber optic cable. The optical element does not prevent EMI from escaping out of the chassis. However, when the devices operate at data rates in the megabit range, the wavelength of the EMI is sufficiently large with respect to the physical dimensions of the slot so as to prevent significant EMI from escaping.

Unfortunately, as the data rates of the fiber optic-based communications increase into the gigabit range, the wavelength of the EMI decreases relative to the physical dimensions of the slot. Consequently, EMI can now escape more efficiently through the slot with current dimensions at these higher frequencies. As described hereinafter, there is trend in the industry to increase the dimensions of the slot, thereby further aggravating the escape of EMI.

There is a trend in the industry to increase the amount of data that can be transferred by using multiple channels instead of a single channel in a transmitter, receiver, or transceiver. An exemplary optical module can include an array of lasers (e.g., an array of VCSELs) for use with a multi-channel fiber optic cable, where the number of channels corresponds to the number of lasers. For example, a typical optical transmitter includes a laser array (e.g., a VCSEL array) and a laser driver circuit for receiving input signals and translating the input signals into voltage levels suitable to drive the laser array.

By increasing the number of channels in the fiber optic cable and the number of lasers in the optical module, more data can be transmitted by the optical transmitter. For example, by having two parallel channels, twice as much data can be transmitted through the optical module. Unfortunately, this trend tends to increase the dimensions of the slot that must now accommodate an array of optical elements instead of a single optical element. Each optical element in the array of optical elements optically interfaces a particular channel in the multi-channel fiber optic cable to a corresponding laser in the laser array.

In summary, the increased data speeds results in EMI having a smaller wavelength that can better escape a given dimension for the slot in the optical modules. Also, the advent of multi-channel optic fiber, arrays of lasers, arrays of photodiodes and arrays of corresponding optical elements has the potential to increase the dimensions of the slot to accommodate the array of optical elements. The decreasing wavelength of the EMI together with the increasing dimensions of the slot magnify the likelihood that significant EMI would escape from the inside of the chassis through the slot. The increase in EMI escape can cause a device to fail the stringent requirements of the governmental regulations concerning EMI emission.

Currently, there is no mechanism for reducing EMI emission at high data rates for a slot that handles a single optical element and for addressing the problem of increased slot dimensions for accommodating a set of optical elements. Consequently, there is a need for a cost-effective solution to reduce EMI emission that can be incorporated efficiently into the optical module.

Based on the foregoing, there remains a need for an electromagnetic interference shielding method and apparatus that overcomes the disadvantages set forth previously.

SUMMARY OF THE INVENTION

According to one aspect of the present invention, a method and system for reducing electromagnetic interference (EMI) that escapes a chassis for housing electro-optic components are provided. In one embodiment, the chassis has a plurality of openings for receiving optical modules. Each optical module has a slot with a first dimension and a second dimension through which EMI can escape. An optical array is disposed in the slot. The optical array has a plurality of optical elements and a first dimension. At least one strip of conducting material is positioned between two optical elements at predetermined intervals as measured along the first dimension. The strip has a first end and a second end and is configured to extend substantially the second dimension. At least one of the first end and the second end are coupled to a ground potential. The strips effectively reduce the amount of EMI that escapes from the slot.

In an alternative embodiment, the chassis has a plurality of openings for receiving optical modules. Each optical module has a slot with a first dimension and a second dimension through which EMI can escape. An optical array is disposed in the slot. The optical array has a plurality of optical elements and a first dimension. At least one strip of conducting material is positioned across the optical element. The strip is configured to extend substantially the first dimension, is coupled to a ground potential, and effectively reduces the EMI that escapes from the slot.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE PREFERRED EMBODIMENT

A system and method for reducing the amount of EMI that escapes from an electro-optic module having a slot are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The present invention can be viewed as an EMI shielding mechanism for an optical module having a slot through which light signals pass. The EMI shielding mechanism effectively reduces the amount of EMI that escapes through the slot in the optical module. The EMI shielding mechanism is especially effective to address the problems of EMI in optical modules having parallel laser arrays and operating at high data bit rates. In the preferred embodiment, the EMI shielding mechanism is integrated with the optical element or optical element array in the optical module.

As will be appreciated and described previously, a chassis has many different types of openings through which EMI can escape. Consequently, each opening in the chassis should be designed to minimize EMI escape therethrough. For example, the opening for the power cord and the opening to receive the optical module should each be designed in such a way as to reduce the amount of EMI emission. The EMI shielding mechanism of the present invention is specifically tailored to effectively address the problem of EMI escape from a slot in the optical module that is operating at high data rates and/or that employs parallel optical channels.

In this regard, as used herein, the terms, such as "significant reduction" of EMI, etc. refer specifically to the amount of EMI escape from the slot in the optical module and do not refer to the overall EMI of the system, which depends on the design of the other openings and interfaces in the chassis.

EMI Shielding Mechanism

Figure 1:
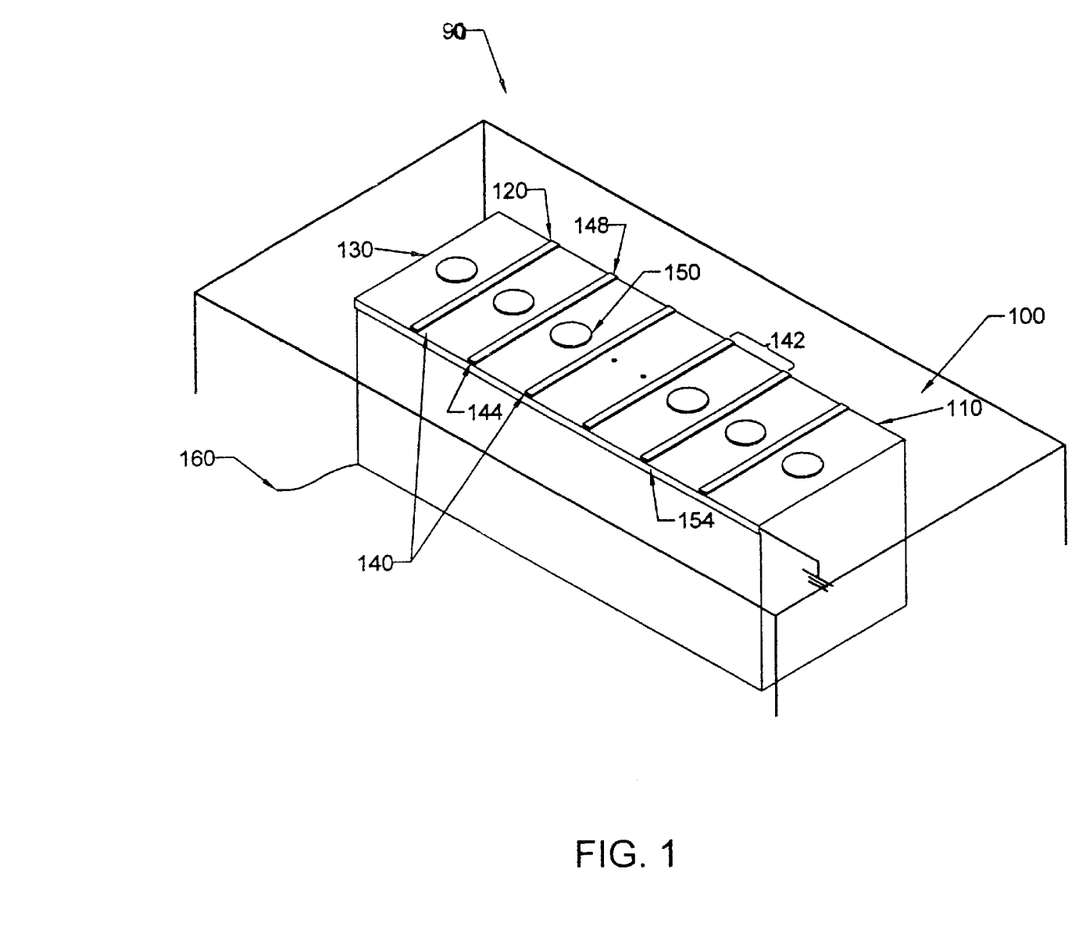
FIG. 1 illustrates the EMI shielding mechanism configured in accordance with one embodiment of the present invention where the EMI shielding mechanism is integrated with one surface of the optical module.

FIG. 1 illustrates the EMI shielding mechanism configured in accordance with one embodiment of the present invention where the EMI shielding mechanism is integrated with one surface of the optical module. An optical module 90 for housing at least oneelectro-optical component is provided. The optical module 90 has a first surface 100 in which the EMI shielding mechanism of the present invention can be implemented. The first surface 100 defines a slot 110 having a first dimension 120 that is important to reducing EMI (also referred to herein as EMI critical dimension 120) and a second dimension 130.

In this embodiment, a plurality of conductive strips 140 that extend along the second dimension 120 at predetermined intervals 142 along the first dimension 120 are provided. The conductive strips 140 act as EMI shields that reduce the amount of EMI that can escape from the optical module 90 by effectively reducing the first dimension 120 into the predetermined intervals 142. Consequently, EMI having a wavelength that can pass through the first dimension 120 is prevented from passing through an interval spacing 142 since the dimensions of the interval spacing 142 is only a fraction of the first dimension. For example, in an exemplary embodiment having twelve channels (i.e., twelve fiber optic cables) and twelve corresponding laser diodes, the interval spacing 142 is about 1/12 of the first dimension 120.

It is noted that the intervals can be uniform along the first dimension 120 or the intervals can vary along the first dimension 120.

It is important that the interval (spacing between the conductive strips 140) be less than a critical spacing that can be determined for a particular application by considering the size of the slot of each optical module and the different sources of EMI emission from the system.

According to one embodiment of the present invention, a number of strips 140 are added to extend across the slot. The number of strips and the interval therebetween can be modified to suit a particular application's EMI emission requirements. It is important that the interval between strips 140 be selected or chosen to be smaller than one-half of the smallest predicted wavelength of significant EMI. The smallest predicted wavelength of the EMI can depend on factors, such as the frequency at which data is being transferred, type of data being transferred, electrical pulse rise and fall times, etc. Furthermore, regulations can specify maximum frequencies of measurement depending on the maximum clock speed in the system.

When the slot dimensions are less that one-half the wavelength of the signal, the following rule of thumb can be employed to determine the decrease in EMI:

Decrease in EMI (in dB)=20*$\log_{10}$ ($\lambda$/2L), where $\lambda$ is the wavelength of the signal and L is the maximum dimension of the slot. For a further description of the above expression, the reader is referred to *Noise Reduction Techniques in Electronic Systems*, Henry W. Ott, $2^{nd}$ Edition, John Wiley & Sons, 1988.

For example, when the rate of data transfer is 2.5 Gigabits per second, FCC Part 15 requires measurements up to 12.5 GHz at which the wavelength of the EMI is about 2.4 cm. Accordingly, in this example, the EMI reduction mechanism of the present invention prescribes adding conductive strips 140 having an interval or spacing therebetween of less than about 1.2 cm so that the escape of EMI can be reduced.

Each conductive strip 140 has a first end 144 that is coupled to the first surface 100 and a second end 148 that is also coupled to the first surface 100. The first surface 100 of the optical module 90 is preferably made form a conductive material that is electrically coupled to a ground potential. In this embodiment, the conductive strips are preferably formed integrally with the first surface 100 that can, for example, be part of the metal housing for the optical module 90 that is grounded.

Although the conductive strip is shown in FIG. 1 as having a generally rectangular geometry, it is noted that the geometry of the conductive strip can be any other geometry to suit the particular application. For example, the geometry can have a perimeter that includes straight portions, curved portions, or a combination thereof. However, it is important that the geometry be continuous so that the conductive strip acts as an electrical conductor from the first end to the second end.

Figure 3A:
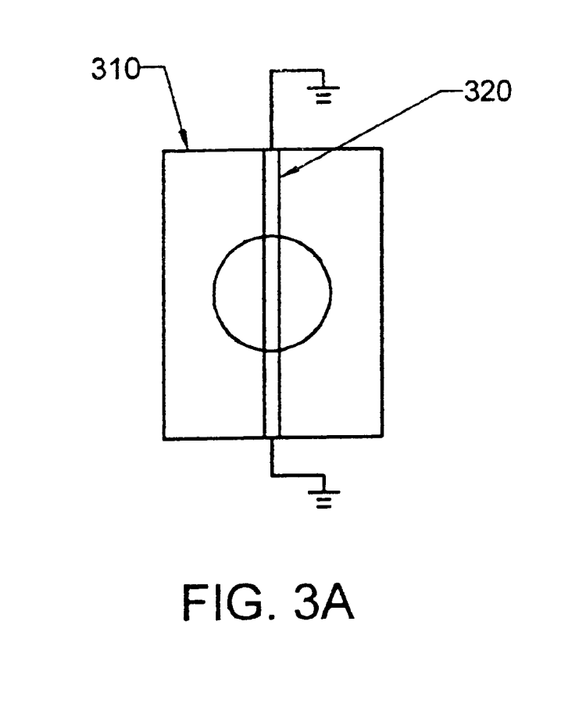
FIG. 3A illustrates the EMI shielding mechanism configured in accordance with another embodiment of the present invention where the EMI shielding mechanism partially covers an optical element.
Figure 3B:
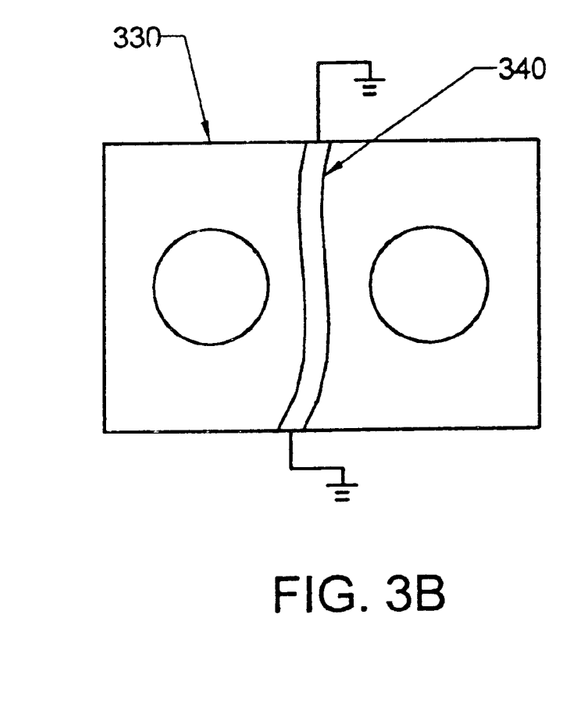
FIG. 3B illustrates the EMI shielding mechanism configured in accordance with another embodiment of the present invention where the EMI shielding mechanism is disposed adjacent to optical elements without covering any portion of the optical elements and the mechanism has a geometry that is different from the previously described embodiments.

For example, an EMI shielding mechanism having an alternative geometry 340 is illustrated in FIG. 3B. The alternative geometry 340 in this embodiment has an "S" shape.

Figure 2:
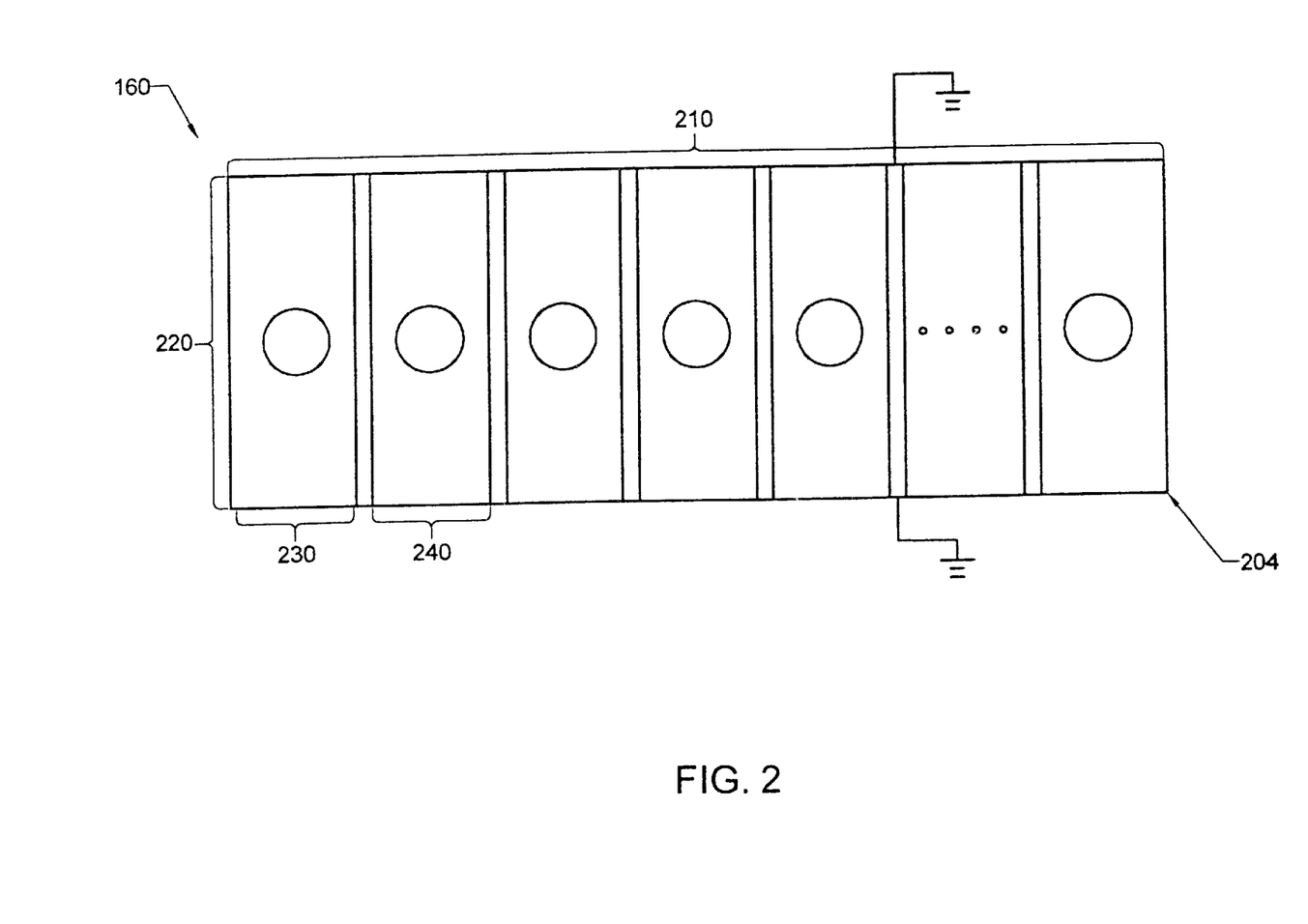
FIG. 2 illustrates the EMI shielding mechanism configured in accordance with an alternative embodiment of the present invention where the EMI shielding mechanism is integrated with an array of optical elements.

FIG. 2 illustrates the EMI shielding mechanism configured in accordance with an alternative embodiment of the present invention where the EMI shielding mechanism is integrated with an array 160 of optical elements. The array 160 includes a plurality of optical elements 204. In one embodiment, there are twelve optical elements 204. The array has a first dimension 210 and a second dimension 220. The EMI shielding mechanism of the present invention is integrated with the array 160 of optical elements. Specifically, a plurality of conductive strips 240 is disposed along the second dimension 220 at predetermined intervals 230 as measured along the first dimension 210. Each conductive strip 240 has a first end and a second that are both electrically connected to a ground potential. For example, when the array 160 of optical elements is fitted into an opening or slot that is defined by a metal housing of an optical module or other module, the ends of the conductive strips 240 are grounded.

Alternatively, the first ends of the conductive strips 240 can be electrically connected to a first grounding strip 154 of conductive material that extends generally along the first dimension, and one or more points of the first grounding strip is electrically connected to a ground potential. Similarly, the second ends of the conductive strips can be electrically connected to a second grounding strip of conductive material that also extends generally along the first dimension, and one or more points of the second grounding strip is electrically connected to a ground potential. It is noted that the first grounding strip 154 can be used alone or in combination with the second grounding strip or visa-versa.

In one embodiment, the slot has a first dimension that is about 1 mm, a second dimension that is about 3 mm and a third dimension that is about 1 mm. Consequently, each strip has a first dimension that is about 25 microns and a second dimension that is preferably slightly longer that the first dimension (e.g., about 1.25 mm for a 1 mm wide slot) in order to overlap the conducting area and to form a good contact.

FIG. 3A illustrates the EMI shielding mechanism configured in accordance with another embodiment of the present invention where the EMI shielding mechanism partially covers an optical element. It is noted that this embodiment can be implemented alone or in combination with the embodiment described above.

In this embodiment, at least one conductive strip is disposed over the optical aperture instead of between the apertures. Consequently, the percentage of lens area that is covered by the conductive strip 320 causes a percentage drop in optical output power. Preferably, this power drop is compensated by boosting the optical power at the source.

Another design consideration for this embodiment is that it is preferable to maintain the spacing or interval between the conductive strips to be greater than about 20-wavelengths of the illumination light. By so doing, the diffraction effects from the conductive strip itself is minimized, and the conductive strip should act as a simple shadow mask. For example, when the incident light has a wavelength of 850 nm, the spacing between conductive strips should be maintained at 17 um (which is about 20-wavelengths).

In one embodiment, conductive strips that are not reflective are employed. When utilizing a conductive strip that is also reflective, it is important to manage light reflected by the conductive strip (i.e., reflections) in this embodiment. One way to manage reflections is to use as little conductive material (e.g., metal) as possible in order to minimize the strength of the reflections. Furthermore, it is preferable to employ a geometry for the conductive strip that provides approximately even coverage across the whole lens aperture. Since the light that is not transmitted through the conductive strip (i.e., a metal shield) is reflected from the conductive strip, it is preferable not to have any metal at the very center of the lens aperture in order to manage this reflection. If not managed properly, this reflection (known as the retro-reflection) can feedback straight into the laser source and make the laser source unstable.

FIG. 3B illustrates the EMI shielding mechanism configured in accordance with another embodiment of the present invention where the EMI shielding mechanism is disposed adjacent to optical elements without covering any portion of the optical elements and the mechanism has a geometry that is different from the previously described embodiments.

It is noted that in the above-described embodiment, the conductive strips can be implemented by using a conductive coating (e.g., an epoxy) that is applied on the array or on the optical elements. For the embodiment, in which the strips are disposed over the optical element, it is preferable to employ a conductive coating that is transparent to light at typical wavelengths.

Figure 4:
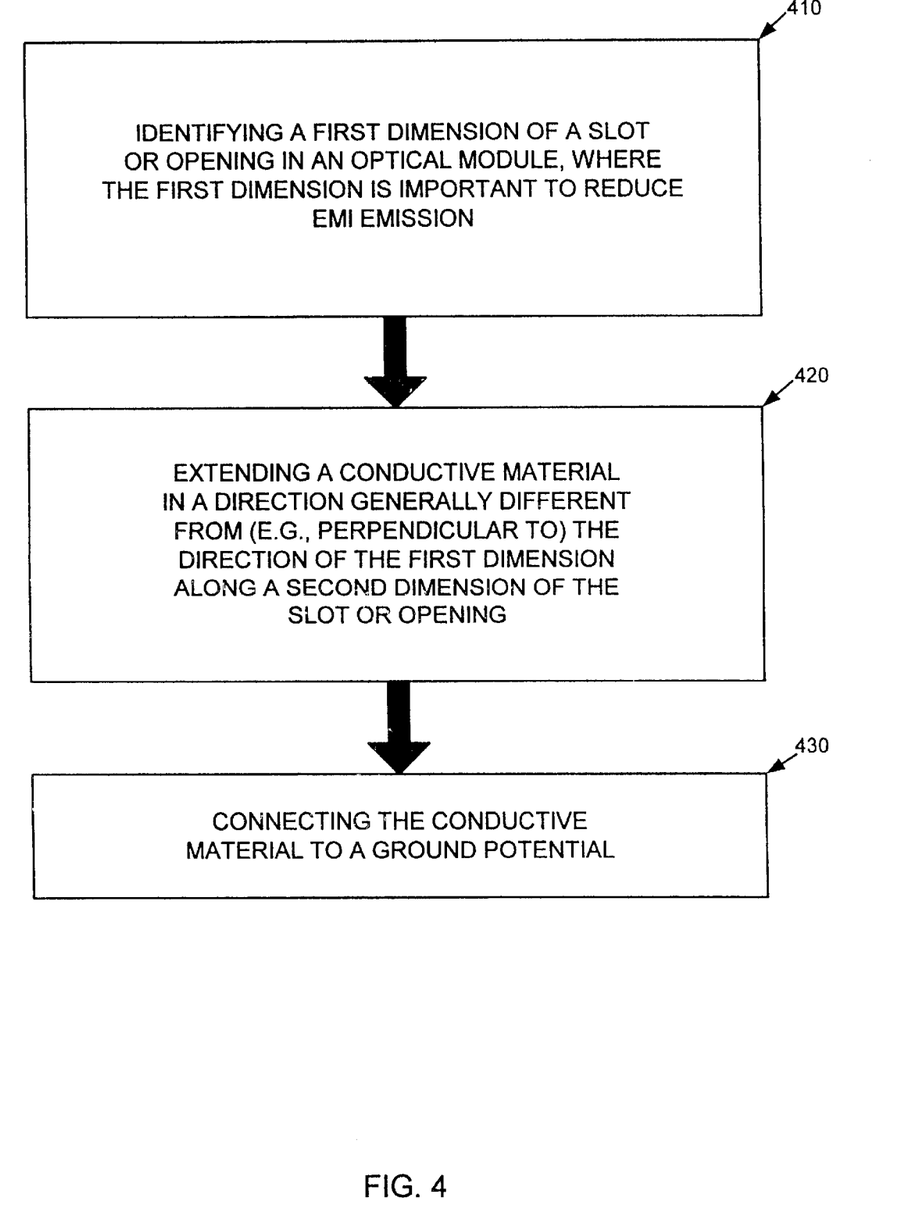
FIG. 4 is a flowchart illustrating the steps for a method of reducing the EMI that escapes from a chassis in accordance with one embodiment of the present invention.

FIG. 4 is a flowchart illustrating the steps for a method of reducing the EMI that escapes from a slot in an optical module in accordance with one embodiment of the present invention. In step 410, a first dimension (e.g., dimension 120 in FIG. 1 or dimension 210 in FIG. 2) of a slot that is important to reduce EMI emission is identified. In step 420, a conductive material is extended along a second dimension of the slot at predetermined intervals along the first dimension. Preferably, the conductive material (e.g., a conductive strip) is integrated with an optical element or optical element array. In step 430, the conductive material is electrically connected to a ground potential.

For example, according to one embodiment, the conductive material has a first end and a second end. In step 430, the first end and the second end of the conductive material are electrically connected to a ground potential (e.g., an electrically grounded housing or chassis). Alternatively, the first ends of the conductive strips can be electrically connected to a first grounding strip of conductive material that extends generally along the first dimension, and one or more points of the first grounding strip is electrically connected to a ground potential. Similarly, the second ends of the conductive strips can be electrically connected to a second grounding strip of conductive material that also extends generally along the first dimension, and one or more points of the second grounding strip is electrically connected to a ground potential.

Figure 5:
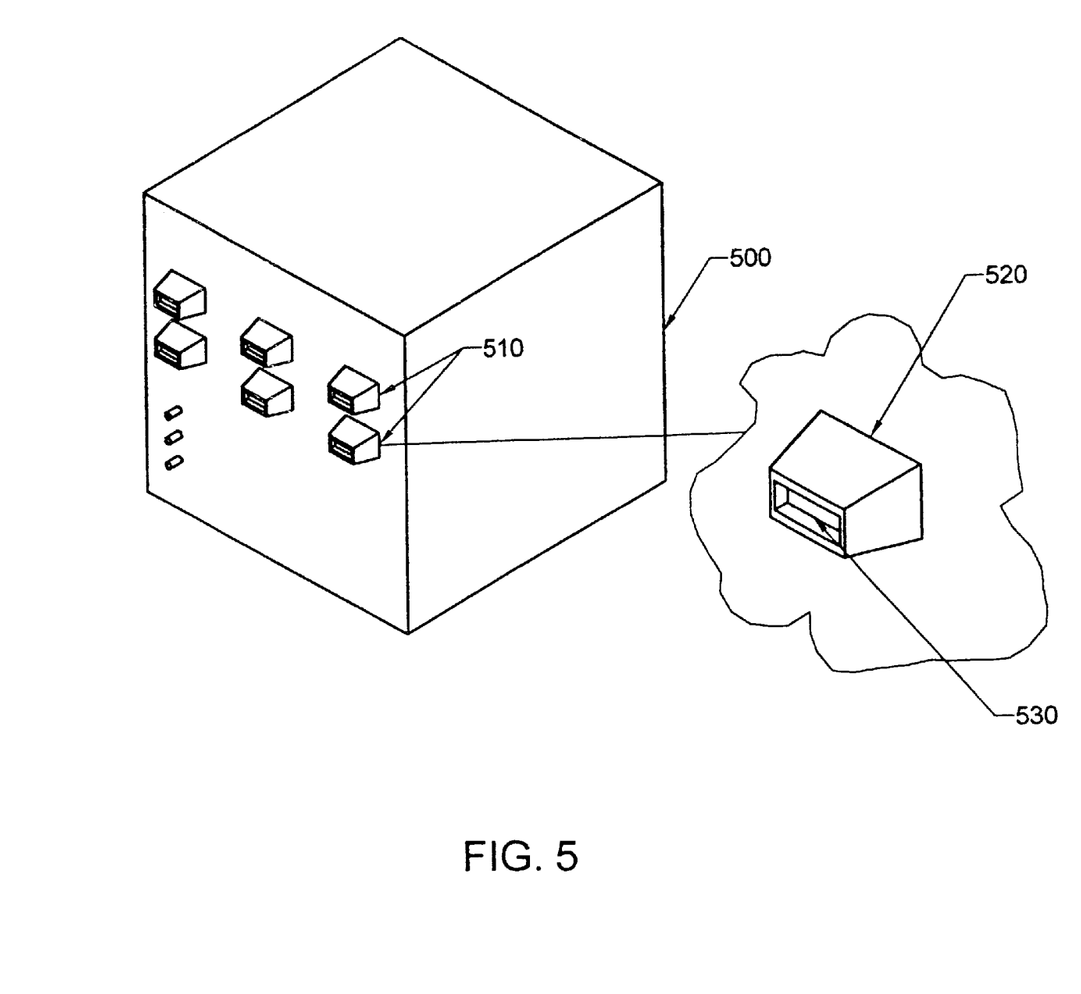
FIG. 5 illustrates a system in which the EMI shielding mechanism of the present invention can be implemented.

FIG. 5 illustrates a system chassis 500 in which the EMI shielding mechanism of the present invention can be implemented. The system chassis 500 includes a plurality of openings 510 through which a respective optical module 520 can extend. Each module 520 has a slot 530 for receiving a fiber optic cable. For example, a fiber optic cable can be inserted into the slot for receiving or transmitting light that enters or exits the slot. Each of these slots 530 can be configured in accordance with the EMI shielding mechanisms taught by the present invention.

The EMI shielding method and apparatus of the present invention has been described in connection with an electro-optic module (e.g., an electro-optical transmitter, an electro-optical receiver, and an electro-optical transceiver). However, it is noted that the EMI shielding mechanism of the present invention is useful for any application in which it is desired to reduce the amount of EMI that escapes through a slot in an optical module. The EMI shielding mechanism of the present invention is especially useful for applications where the data rate is in the gigabit range and/or multi-channel laser arrays or photodiode arrays are employed.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A method for reducing the amount of electromagnetic interference (EMI) from passing through an opening, comprising:
    disposing at least one strip of conducting material across the opening at predetermined intervals, the strip having a first end and a second end;
    electrically connecting at least one of the first end and the second end to a ground potential.

2. The method of claim 1 further comprising:
    fabricating an optical array having a first optical element and a second optical element;
    wherein the step of disposing at least one strip of conducting material across the opening at predetermined intervals includes the step of depositing at least one strip of conducting material between the first optical element and the second optical element.

3. The method of claim 1 wherein the step of electrically connecting at least one of the first end and the second end to a ground potential includes
    coupling the first end to a first grounding strip; and
    coupling the first grounding strip to a ground potential.

4. The method of claim 3 further comprising:
    coupling the second end to a second grounding strip; and
    coupling the second grounding strip to a ground potential.

5. The method of claim 1 wherein the step of electrically connecting at least one of the first end and the second end to a ground potential includes
    coupling the second end to a second grounding strip; and
    coupling the second grounding strip to a ground potential.

6. An electromagnetic interference (EMI) shielding apparatus for reducing the amount of electromagnetic interference (EMI) from passing through an opening having a first dimension and a second dimension comprising:
    at least one strip of conducting material extending across the second dimension at predetermined intervals as measured along the first dimension;
    wherein the strip has a first end and a second end; wherein at least one of the first end and the second end is electrically connected to a ground potential; and
    wherein the strip reduces the electromagnetic interference (EMI) that escapes through the opening.

7. The apparatus of claim 6 wherein the shielding apparatus is integrated with an optical array having a plurality of optical elements.

8. The apparatus of claim 6 wherein the shielding apparatus is integrated with a surface of an optical module.

9. The apparatus of claim 8 wherein the optical module is one of an optical transmitter, an optical receiver, and an optical transceiver.

10. The apparatus of claim 6 wherein the shielding apparatus is integrated with a chassis of a networking device.

11. The apparatus of claim 7 further comprising:
a plurality of strips of conducting material;
wherein each strip is disposed between two optical elements and the predetermined interval is generally uniform.

12. The apparatus of claim 7 further comprising:
a plurality of strips of conducting material;
wherein each strip is disposed between two optical elements and the predetermined interval varies.

13. The apparatus of claim 6 wherein the first dimension is about 3 mm and the second dimension is about 1 mm.

14. The apparatus of claim 6 wherein each strip has a first dimension that is about 25 microns and a second dimension that is about 1.25 mm.

15. The apparatus of claim 6 further comprising:
a first grounding strip coupled to the first end; and
wherein the first grounding strip is coupled to a ground potential.

16. The apparatus of claim 15 further comprising:
a second grounding strip coupled to the second end; and
wherein the second grounding strip is coupled to a ground potential.

17. A networking device comprising:
an optical module for converting electrical signals into corresponding light signals and vice versa;
the optical module having a conductive surface that defines an opening for allowing light to pass therethrough;
wherein the opening has a first dimension and a second dimension;
at least one strip of conducting material extending across the second dimension at predetermined intervals as measured along the first dimension;
wherein the strip has a first end and a second end; wherein at least one of the first end and the second end is electrically connected to a ground potential; and
wherein the strip reduces the electromagnetic interference (EMI) that escapes through the opening.

* * * * *